(12) United States Patent
Choi et al.

(10) Patent No.: US 9,169,550 B2
(45) Date of Patent: Oct. 27, 2015

(54) SURFACE TREATMENT METHOD FOR COATING LAYER

(75) Inventors: Kwang Hoon Choi, Gyeonggi-do (KR);
In Woong Lyo, Gyeonggi-do (KR);
Woong Pyo Hong, Gyeonggi-do (KR);
Hyuk Kang, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 13/461,167

(22) Filed: May 1, 2012

(65) Prior Publication Data

US 2013/0202811 A1    Aug. 8, 2013

(30) Foreign Application Priority Data

Feb. 8, 2012   (KR) .................. 10-2012-0013022

(51) Int. Cl.
*B05D 3/02*    (2006.01)
*C23C 14/06*   (2006.01)
*C23C 14/02*   (2006.01)

(52) U.S. Cl.
CPC ........... *C23C 14/0641* (2013.01); *C23C 14/024* (2013.01)

(58) Field of Classification Search
USPC ................................. 427/534, 122, 402, 248.1
See application file for complete search history.

(56) References Cited

U.S. PATENT DOCUMENTS

| | | | |
|---|---|---|---|
| 2005/0011747 A1 | 1/2005 | Selvamanickam et al. | |
| 2008/0311310 A1* | 12/2008 | Massler et al. | 427/534 |
| 2010/0272985 A1* | 10/2010 | Ho et al. | 428/323 |
| 2011/0142384 A1* | 6/2011 | Hofmann | 384/42 |

FOREIGN PATENT DOCUMENTS

| | | | |
|---|---|---|---|
| CN | 1570196 A | * | 1/2005 |
| JP | 2008-510074 | | 4/2008 |
| KR | 10-2002-0006387 | | 1/2002 |
| KR | 10-0773486 | | 10/2007 |
| KR | 10-2011-0017828 | | 2/2011 |
| WO | WO 2010017984 A1 | * | 2/2010 |

OTHER PUBLICATIONS

Han, J.G. et al, "Microstructure and mechanical properties of Ti—Ag—N and Ti—Cr—N superhard nanostructured coatings," Surface and Coatings Technology, 174-175 (2003) 738-743.

* cited by examiner

*Primary Examiner* — Dah-Wei D Yuan
*Assistant Examiner* — Nga Leung V Law
(74) *Attorney, Agent, or Firm* — Mintz Levin Cohn Ferris Glovsky and Popeo, P.C.; Peter F. Corless

(57) ABSTRACT

Disclosed is a surface treatment method for producing a coating layer, which improves surface properties (e.g., low friction wear-resistance) of the coating layer at high temperature. The surface treatment method controls a process pressure during the formation of a coating layer to form a fine surface morphology with increased silver (Ag) content. The surface treatment method includes: heating a coated material in a chamber; removing foreign substances from the surface of the heated, coated material; forming a buffer layer on the surface of the coated material; and forming a coating layer on the buffer layer, wherein the process pressure is controlled during the formation of the coating layer to improve the surface properties at high temperatures.

13 Claims, 7 Drawing Sheets

SURFACE TREATMENT METHOD FOR COATING LAYER

CROSS-REFERENCE TO RELATED APPLICATION

This application claims under 35 U.S.C. §119 (a) the benefit of Korean Patent Application No. 10-2012-0013022 filed Feb. 8, 2012, the entire contents of which are incorporated herein by reference.

BACKGROUND (a) Technical Field

The present invention relates to a surface treatment method for a coating layer. More particularly, it relates to a surface treatment method for a coating layer that provides improved surface properties for the coated material.

(b) Background Art

The exhaust temperature of current vehicles has increased due to modern technologies such as engine downsizing and high powerization (e.g., gasoline direct injection (GDI), turbo charger, etc.), and thus vehicles require components that have heat-resistant properties and beneficial friction properties at high temperatures.

In order to provide such heat-resistant properties and friction properties at high temperatures, the surfaces of conventional art components for a vehicle operation have been coated with diamond-like carbon (DLC). DLC has a relatively high coating hardness together with chemical resistance and lubricity, and thus the mechanical properties of the components can be improved when such a surface coating is applied. Unfortunately, the DLC coating has very poor heat-resistant properties, and is not suitable for coating components that require heat shielding. Accordingly, there is an urgent need for a new coating material that can replace DLC as a surface coating.

SUMMARY OF THE DISCLOSURE

The present invention provides a surface treatment method for a coating layer, which can improve surface properties (e.g., low friction properties and wear-resistant properties) at high temperature, that controls pressure during the process of forming a coating layer to form fine surface morphology, and also increases silver (Ag) content.

In one aspect, the present invention provides a surface treatment method for a coating layer, the method including: heating a coated material in a chamber; removing foreign substances from the surface of the heated, coated material; forming a buffer layer on the surface of the coated material; and forming a coating layer on the buffer layer, where the process pressure is controlled during the formation of the coating layer to improve surface properties at high temperatures.

In an exemplary embodiment, formation of the coating layer may be performed at a process pressure ranging from 15 to 20 mTorr, which is higher than the process pressure (typically 5 mTorr) used in forming the buffer layer, to form a fine surface morphology and increase Ag content.

In another exemplary embodiment, during formation of the buffer layer, a Ti buffer layer and a TiN buffer layer may be deposited on the surface of the coated material in the order of the size of the respective lattice constants of each buffer layer.

Other aspects and exemplary embodiments of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
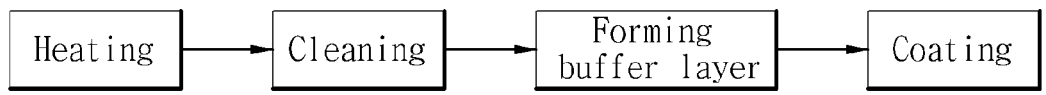
FIG. 1 is a block diagram showing a surface treatment method for a coating layer in accordance with an exemplary embodiment of the present invention.

Reference numerals set forth in the Drawings includes reference to the following elements as further discussed below:

| 10: test piece | 11: Ti buffer layer |
|---|---|
| 12: TiN buffer layer | 13: buffer layers |
| 14: TiAgN coating layer | |

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50, as well as all intervening decimal values between the aforementioned integers such as, for example, 1.1, 1.2, 1.3, 1.4, 1.5, 1.6, 1.7, 1.8, and 1.9. With respect to sub-ranges, "nested sub-ranges" that extend from either end point of the range are specifically contemplated. For example, a nested sub-range of an exemplary range of 1 to 50 may comprise 1 to 10, 1 to 20, 1 to 30, and 1 to 40 in one direction, or 50 to 40, 50 to 30, 50 to 20, and 50 to 10 in the other direction.

The above and other features of the invention are discussed infra.

Figure 2:
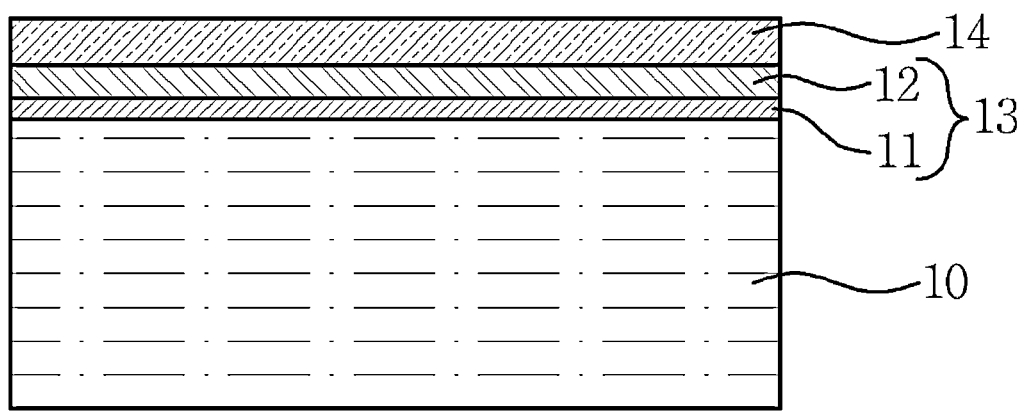
FIG. 2 is a cross-sectional view showing that a coating layer is formed in accordance with an exemplary embodiment of the present invention.

FIG. 1 is a block diagram showing a surface treatment method for a coating layer in accordance with an exemplary embodiment of the present invention. FIG. 2 is a cross-sectional view showing a coating layer formed in accordance with an exemplary embodiment of the present invention.

The present invention provides a surface treatment method for a coating layer, which can improve heat-resistant properties and friction properties of the surface at high temperatures by forming a fine surface morphology and increasing silver (Ag) content in the coating layer. According to an exemplary embodiment, the present invention can improve the properties of a surface coating layer 14 by changing the process pressure between a buffer and a coating.

The surface treatment method for the coating layer in accordance with an exemplary embodiment of the present invention applies TiAgN, a coating material, to the surface of a component using a hybrid physical vapor deposition (PVD) apparatus. The surface treatment method includes a heating step, a cleaning step, a buffer step, and a coating step.

In the heating step, test piece 10 to be coated is placed in a chamber and heated by maintaining the temperature of the chamber within a predetermined temperature range for a predetermined period of time. This removes water from the surface of the test piece 10, and also maintains a constant temperature distribution throughout the test piece 10. For example, it is preferable to maintain the temperature of the chamber in the range from 300° C. to 500° C. If the process is performed below 300° C., the synthesis of TiN, which is considered as a base for TiAgN (i.e., a nanocomposite material of TiN and Ag), is not achieved. Consequently, the surface coating may not have optimum heat-resistant properties, and may also have undesirable mechanical properties such as, for example, stiffness. If the temperature exceeds 500° C., the stiffness of the base material is reduced, even if the test piece of the base material is surface-treated (e.g., cementation). Moreover, if the temperature is 500° C. or higher, the coating layer may be peeled off by adhesion force and internal stress due to the decrease in stiffness of the base material, or the base material below the coating layer may be destroyed (e.g., by a process related to the Hertz contact stress). Therefore, it becomes difficult to apply the coated material to components for vehicle operation.

The above-described temperature range may be adjusted in an ion cleaning step and a step of forming a Ti buffer layer (deposition of Ti at high bias voltage) as long as the temperature within the range does not cause any problem during evaluation of the coating layer.

According to an exemplary embodiment, the time for maintaining the temperature in the chamber may be 40 minutes or longer, so long as no critical problems occur. However, as the processing time increases, so does the cost of the process. On the other hand, if the processing time is short, (1) internal stress occurs during formation of the coating layer due to a temperature gradient in the test piece, (2) it is difficult to remove contaminants (water) from the surface and improve the reliability of the vacuum process, and (3) the pumping speed is reduced during heating (reaching a process vacuum degree of $5 \times 10^{-5}$). Consequently, the time of 40 minutes has been experimentally verified as a preferred time for an exemplary embodiment of the invention.

In the cleaning step, foreign substances on test piece 10 are removed with ethanol and acetone, and test piece 10 is subjected to ion etching using an ion gun for more than 20 minutes. The ion etching process can remove the foreign substances from the surface of test piece 10 and, at the same time, improve the surface properties of test piece 10, thereby increasing the adhesion force between a buffer layer and the base material of the test piece 10.

An interfacial stress singularity may occur due to a difference in lattice constants between the base material and the coating layer at the boundary surface between the base material of the test piece 10 and the coating layer 14, thereby causing coating layer 14 to peel away from the base material. Accordingly, buffer layer 13 is formed to solve these problems.

In the step of forming the buffer layer 13, a Ti buffer layer 11 and a TiN buffer layer 12 re sequentially deposited on the surface of test piece 10, and the size of the lattice constant of each layer increases in the following order: the base material of the test piece 10, the Ti buffer layer 11, the TiN buffer layer 12, and the TiAgN coating layer 14. As a result, the Ti buffer layer 11 reduces the difference in lattice constant between the base material and the TiN buffer layer 12, and the TiN buffer layer 12 reduces the difference in lattice constant between the Ti buffer layer 11 and the TiAgN coating layer 14. The buffer layer 13 reduces the difference in lattice constant between the base material and the coating layer 14 to prevent the coating layer 14 from being peeled off from the base material and increase the adhesion to force of the coating layer 14.

When the Ti buffer layer 11 is formed, the bias voltage is maintained at a range from about 300 V to 400 V, and this bias voltage increases the potential difference of a positive electrode to accelerate the deposition of the material (e.g., the Ti buffer layer 11). If the bias voltage is too low, Ti ions may not be deposited on the base material, whereas, if it is too high, the Ti ions may bounce off of the base material, and thus the Ti buffer layer 11 may not be deposited, or the deposition thickness may be reduced. Accordingly, the above-described range is preferred in an exemplary embodiment of the invention. When the Ti buffer layer 11 is deposited in this range, the Ti buffer layer may be implanted into the base material of the test piece 10 together with the ion cleaning effect. Moreover, when the TiN buffer layer 12 is formed, it is preferable that the bias voltage is maintained within a range from about 100 V to 150 V.

In the step of forming the buffer layer 13, the adhesion force between the layers can be increased by maintaining the process pressure at a high vacuum of about 5 mTorr to 10 mTorr.

In the coating step, the TiAgN coating layer 14 is deposited on the base material, in which nitrogen is used to improve the heat-resistant properties of the test piece 10 (i.e., the base material, a component for vehicle operation). The coating step is performed in the same manner as the step of forming the buffer layer 13 using the same equipment. In the coating step, the process pressure is 15 to 20 mTorr. Without being bound by theory, the reason that the process pressure in the deposition process of the coating layer 14 is higher than the process pressure (5 to 10 mTorr) in the deposition process of the buffer layer 13 is to improve the surface properties of the coating layer 14. In other words, during the deposition of the coating layer 14, the process pressure is generally the same as that during the step of forming the buffer layer 13. However, it is possible to increase the Ag content by forming a fine surface morphology to change the fine structure of the surface layer by increasing the process pressure to 15 to 20 mTorr to reduce the degree of vacuum in the chamber.

Figure 3:
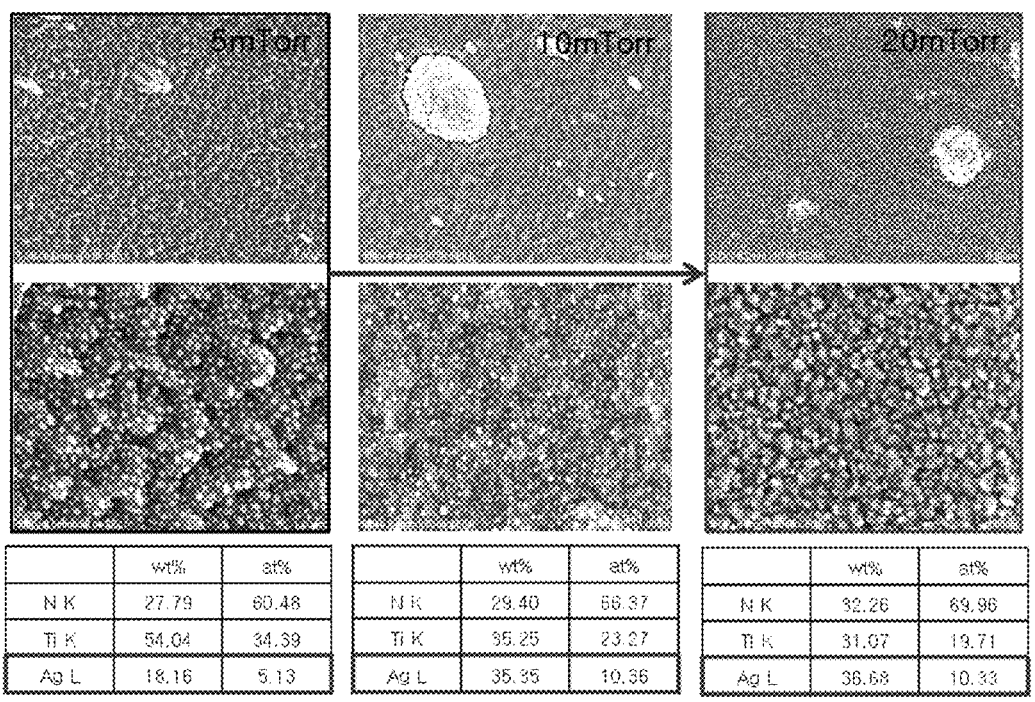
FIG. 3 shows exemplary images of the fine surface morphology and increased Ag content produced by an increase in process pressure.
Figure 4:
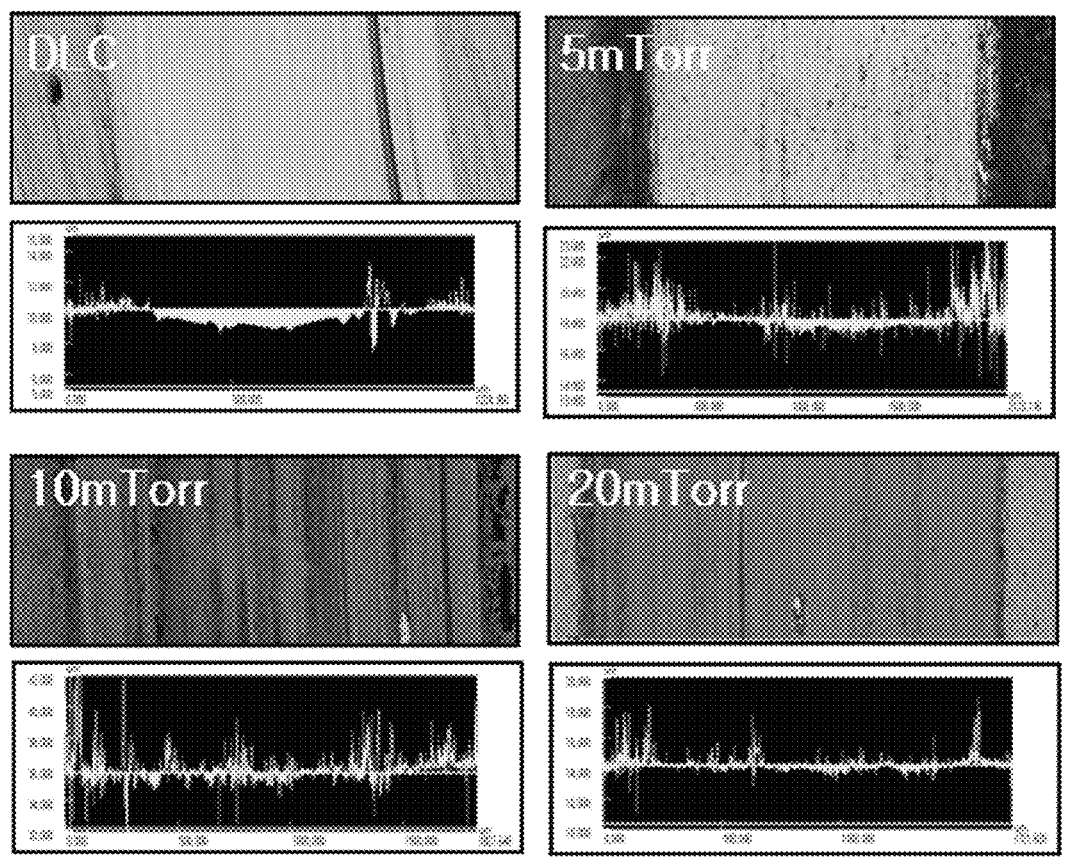
FIG. 4 shows exemplary images of improved coating quality produced by an increase in process pressure.
Figure 5:
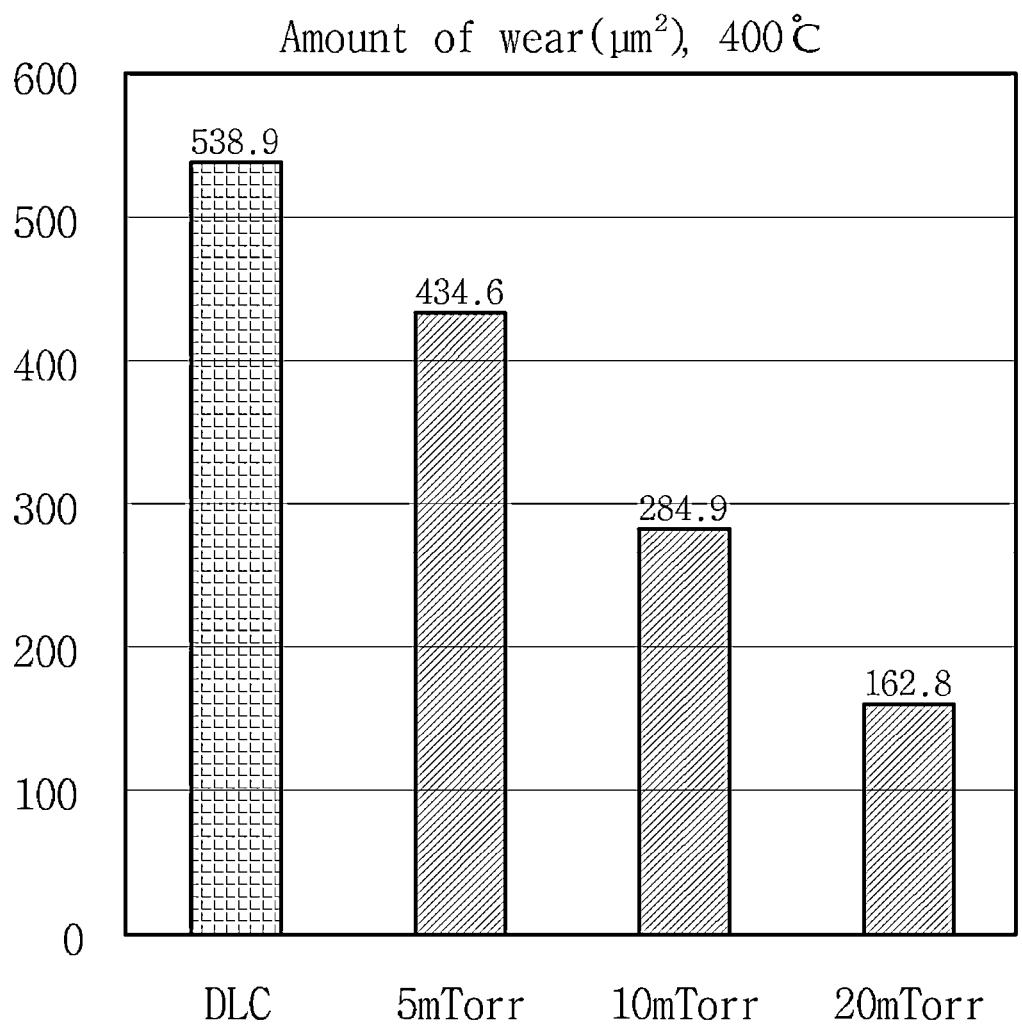
FIG. 5 is a graph showing a change in the amount of wear in FIG. 4 produced by an increase in process pressure.

FIG. 3 shows images of an exemplary fine surface morphology and increased Ag content produced by an increase in process pressure. FIG. 4 shows exemplary images of improved coating quality according to an increase in process pressure. FIG. 5 is a graph showing a change in the amount of wear in the coating shown in FIG. 4 produced by an increase in process pressure.

When the pressure is increased during the process of forming the coating layer 14, compared to that in the process of forming the buffer layer 13, it is possible to provide fine surface morphology and increase the Ag content as shown in FIG. 3. Moreover, when the process pressure was increased to 5 mTorr, 10 mTorr, and 20 mTorr during formation of the coating layer 14, compared to that during formation of the buffer layer 13, the amount of wear at a high temperature (e.g., 400° C.) was significantly reduced compared to an existing conventional art DLC coating, thus improving the wear-resistant properties at high temperatures as shown in FIGS. 4 and 5. However, in the case where the process pressure is increased to 30 mTorr or higher, the flow in the chamber increases, and the coating quality is significantly reduced due to the presence of impurities, and the surface morphology is extended: these characteristics are undesirable.

Figure 6:
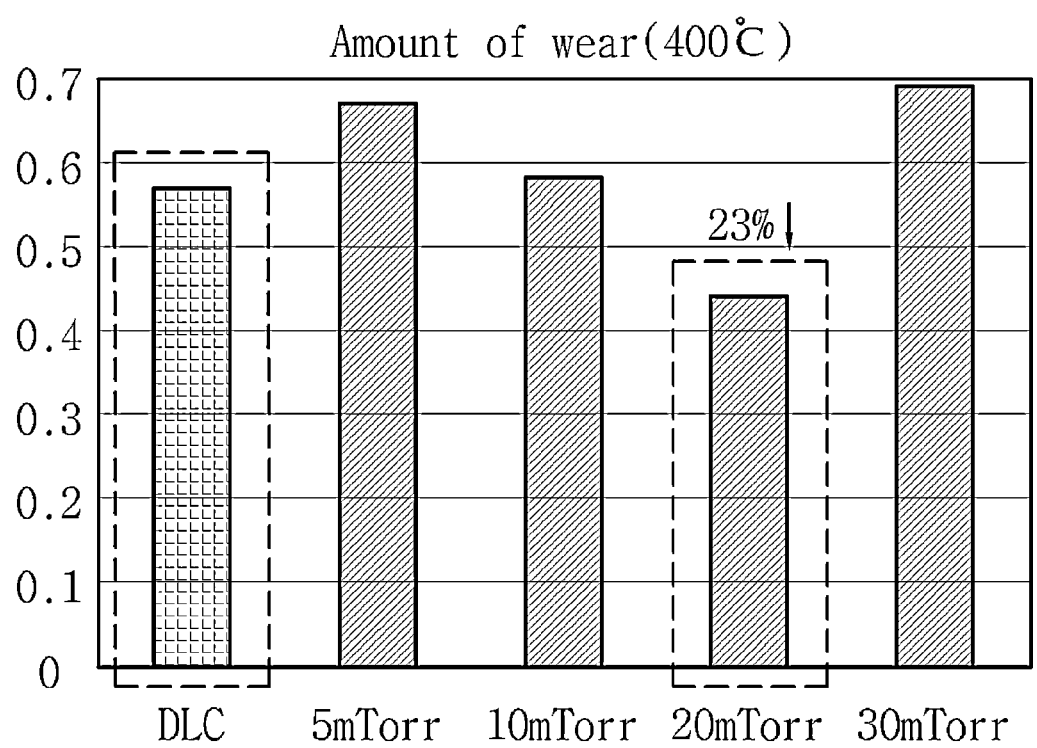
FIG. 6 is a graph showing a change in the coefficient of friction produced by an increase in process pressure.
Figure 7:
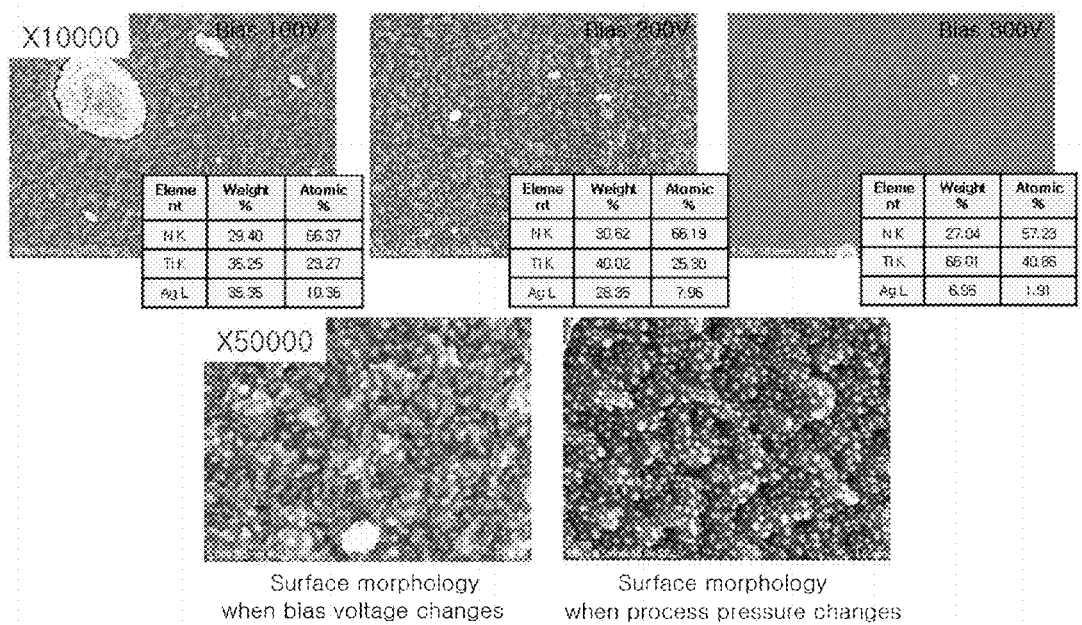
FIG. 7 shows images and tables of changed surface morphology and Ag content produced by an increase in bias voltage.

FIG. 6 is a graph showing a change in the coefficient of friction according to an increase in process pressure, and FIG. 7 shows images and tables of changed surface morphology and Ag content according to an increase in bias voltage. Moreover, as shown in FIG. 6, the friction properties (i.e., the coefficient of friction) produced by the increase in the process pressure are reduced as the process pressure increases. For example, when the process pressure was increased to 20 mTorr, the coefficient of friction was reduced by 23% compared to an existing DLC coating. However, if the process pressure is increased to 30 mTorr or higher, the friction properties may be reduced.

Additionally, when the bias voltage increases during the deposition of the coating layer 14, a fine surface morphology can be formed as shown in FIG. 7. However, the Ag content of the coating layer 14 is reduced, the surface shape is changed, and the surface properties at high temperature are not improved.

As described above, the present invention provides the following advantages.

The formation of the buffer layer in the manufacturing process for forming the TiAgN coating layer using the hybrid PVD apparatus is performed by maintaining the process pressure at a high vacuum of 5 to 10 mTorr to increase the adhesion force between the layers. However, the coating process of forming the coating layer is performed by reducing the degree of vacuum at 15 to 20 mTorr such that the process pressure between the deposition of the buffer layer and the deposition of the coating layer is changed to form a fine surface morphology and increase the Ag content, thereby improving the properties of the surface coating layer, such as, for example, the heat resistance properties, the low friction properties, and the wear-resistant properties.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A surface treatment method, comprising:
placing a test piece to be coated in a chamber;
heating the test piece at a temperature for a period of time removing foreign substances from the surface of the heated test piece with a solvent;
forming at least one buffer layer on the surface of the test piece, wherein the at least one buffer layer comprises titanium (Ti); and
forming a coating layer on the buffer layer,
wherein the process pressure is controlled during formation of the coating layer,
wherein the buffer layer comprises a first layer having a first lattice constant and a second layer having a second lattice constant, wherein the first lattice constant is smaller than the second lattice constant, wherein the first layer is deposited on the test piece, and the second layer is deposited on the first layer; and
wherein the coating layer comprises titanium-silver-nitrogen (TiAgN) and the coating layer is formed under a vacuum that ranges from 15 to 20 mTorr, thereby forming a surface morphology.

2. The method of claim 1, wherein the temperature ranges from 300° C. to 500° C.

3. The method of claim 1, wherein the foreign substances are water and/or impurities.

4. The method of claim 1, wherein the period of time is 40 minutes or more.

5. The method of claim 1, wherein the period of time is about 40 minutes.

6. The method of claim 1, wherein the solvent is selected from the group consisting of ethanol and acetone.

7. The method of claim 1, further comprising etching the cleaned test piece with an ion gun for an etching time.

8. The method of claim 7, wherein the etching time is 20 minutes or more.

9. The method of claim 1, wherein the buffer layer comprises a first layer comprising Ti and a second layer comprising titanium-nitrogen (TiN).

10. The method of claim 1, wherein the first layer is formed in the presence of a bias voltage that ranges from 300 V to 400V.

11. The method of claim 1, wherein the second layer is formed in the presence of a bias voltage that ranges from 100 V to 150.

12. The method of claim 1, wherein the buffer layer is formed under a vacuum.

13. The method of claim 12, wherein the vacuum ranges from 5 to 10 mTorr.

* * * * *